(12) United States Patent
De Sandre et al.

(10) Patent No.: US 7,504,862 B2
(45) Date of Patent: Mar. 17, 2009

(54) LEVEL SHIFTER TRANSLATOR

(75) Inventors: Guido De Sandre, Brugherio (IT); Marco Poles, Ghedi (IT); Marco Pasotti, Travacò Siccomario (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 0 days.

(21) Appl. No.: 11/321,732

(22) Filed: Dec. 28, 2005

(65) Prior Publication Data
US 2006/0226873 A1  Oct. 12, 2006

(30) Foreign Application Priority Data
Dec. 28, 2004  (IT)  ................... MI2004A0002534

(51) Int. Cl.
*H03K 19/0175* (2006.01)
(52) U.S. Cl. ..................... 326/81; 326/80; 327/333
(58) Field of Classification Search ............... 326/68, 326/80, 81; 327/333, 379
See application file for complete search history.

(56) References Cited
U.S. PATENT DOCUMENTS
6,002,292 A * 12/1999 Allen et al. ............... 327/379

7,034,573 B1 * 4/2006 Chang ........................ 326/68
7,205,819 B2 * 4/2007 Davis ......................... 327/333
2006/0033530 A1 * 2/2006 Seo .............................. 326/81

FOREIGN PATENT DOCUMENTS
JP       07086913 A  *  3/1995

* cited by examiner

*Primary Examiner*—Daniel D Chang
(74) *Attorney, Agent, or Firm*—Lisa K. Jorgensen; Paul F. Rusyn; Graybeal Jackson LLP (57) ABSTRACT

Level shifter translator of the type comprising at least one first transistor and one second MOS transistor belonging to respective circuit branches connected with a first common conduction terminal and connected towards a first potential reference and receiving, on the respective conduction terminals, input differential voltages, the first and the second transistor have respective circuit branches referring to a biasing circuit with current mirror, a third transistor allows to couple the second transistor to said biasing circuit, an inverter connected to an output of said the circuit with the output driving the third transistor.

10 Claims, 5 Drawing Sheets

LEVEL SHIFTER TRANSLATOR

PRIORITY CLAIM

This application claims priority from Italian patent application No. MI2004A 002534, filed Dec. 28, 2004, which is incorporated herein by reference.

TECHNICAL FIELD

The present invention relates generally to a level-shifter translator.

The invention particularly, but not exclusively, relates to a level shifter translator optimized for non volatile memories, in particular of the "flash" type and the following description is made with reference to this field of application by way of illustration only.

BACKGROUND

As it is well known, level-shifter translators are circuits interfacing circuit logics with different supply voltages.

The technological development trend as regards circuitry of the digital type, such as for example transistors, logic gates or memory elements, is to decrease the supply voltages, thus forcing a reduction in the length of the channel interposed between source and drain in transistor-like structures. But in the case of non volatile memory, for example of the flash type, high supply voltages have not immediately undergone a reduction as in digital logic, and thus remain substantially unvaried.

Therefore, a need arises to interface circuit logics having more and more marked differences in the supply voltages. The difference between the supply voltage of a flash memory and the supply voltage of a memory cell transistor to be supplied continues to grow.

Figure 1:
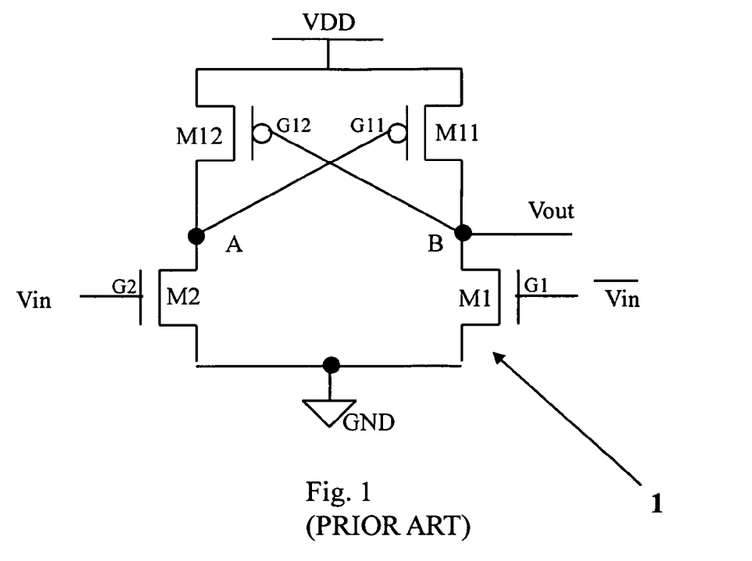
FIG. 1 schematically shows a standard shifter translator with positive feedback, according to the prior art.

A first known technical solution to meet the need to interface circuit logics with marked differences in the supply voltage uses the circuit shown in FIG. 1.

This figure shows a standard shifter translator 1 with differential cell with positive feedback, comprising two pairs M1, M2 and M11, M12 of MOS transistors arranged symmetrically with respect to two reference terminals of supply VDD and ground GND voltages.

In particular, the transistor M1 of the NMOS type has a control terminal G1 to which is input a first supply signal $\overline{Vin}$, for example of low logic value, has a conduction drain terminal coinciding with a circuit node B and a conduction source terminal coinciding with the ground terminal GND.

The transistor M2 of the NMOS type has in turn a control terminal G2 which is input a second supply signal corresponding to Vin, in this case a high logic value, has a conduction drain terminal coinciding with a circuit node A and a conduction source terminal coinciding with the source terminal of the transistor M1 thus connected to the ground terminal GND.

The transistor M2 has the drain terminal coinciding with a circuit node A and with a drain terminal of a transistor M12 of the PMOS type. The transistor M12 is, in turn, connected to the supply voltage VDD through its own source terminal. A control terminal G11 of a transistor M11 of the PMOS type is also connected to the circuit node A.

The transistor M11, of the PMOS type, symmetrical with respect to the transistor M12, has a source terminal connected to VDD and a drain terminal connected to a circuit node B, symmetrical with respect to the circuit node A, and connected to the drain terminal of the transistor M1. The circuit node B is also connected to the control terminal G12 of the transistor M12.

The voltage of the circuit node B is the output voltage Vout of the shifter translator 1.

Although advantageous in several aspects, this first known solution has various drawbacks.

For example, the transitions from the high logic level HV [high VDD] to the low logic level LV [GND], VDD=>GND, and vice versa from the low logic level to the high logic level, GND=>VDD, occur with very different times with respect to one another.

Moreover, the response times of the transitions VDD->GND and GND->VDD vary remarkably when the temperature varies.

The standard shifter translator 1, for its operation, resorts to a positive feedback which is started by varying the voltages at the nodes A and B in an opposite way. These nodes also respond to the commands at low voltage (LV), Vin and $\overline{Vin}$, only if the transistors M1 and M2 of the NMOS type are much more conductive than the transistors M11 and M12 of the PMOS type, so as to "win" the positive feedback.

Additionally, once the positive feedback is started at the shifter circuit 1, a slowdown in the transaction from one level to the other may also occur due to the capacitive coupling which is created between the nodes A and B.

Thus, due to a more and more marked difference in the supply voltages of the logic and memory circuits, as above indicated, the transition from low to high voltage occurs with greater and greater difficulty. This implies that when logic circuits are interfaced, a delay is created which becomes a limiting factor for the performances of flash memory circuits, especially in terms of access time to the memory, where the times at stake are very narrow.

SUMMARY

An embodiment of the present invention is a level-shifter translator, having such structural and functional characteristics as to allow an interfacing between logic circuits with different supply voltages and overcoming one or more limits and/or drawbacks of conventional translators.

This embodiment operates without starting a positive feedback, thus often providing a speed up in the transition from one logic level to another.

BRIEF DESCRIPTION OF THE DRAWINGS

Characteristics and advantages of a circuit according to an embodiment of the invention will be apparent from the following description thereof, given by way of indicative and non limiting example with reference to the annexed drawings.

DETAILED DESCRIPTION

Figure 2:
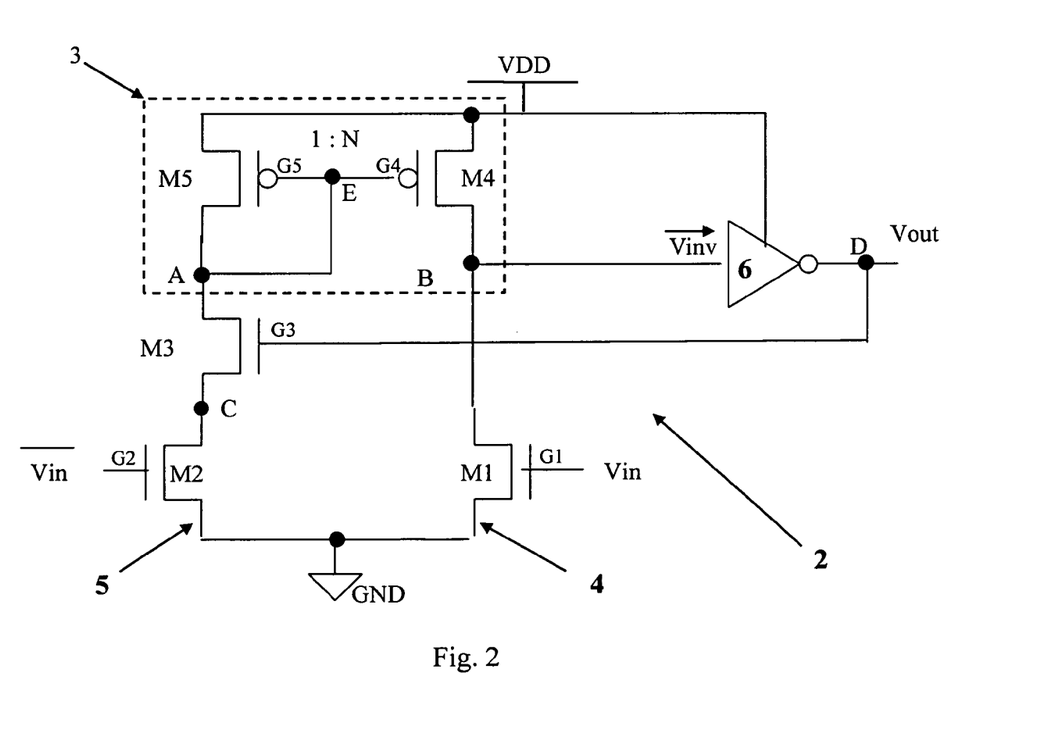
FIG. 2 shows a level shifter translator realized according to an embodiment of the present invention.

With reference to these figures, and in particular to FIG. 2, a shifter translator is globally indicated with number 2 and it is realized according to an embodiment of the present invention. In this figure, the components and the signals already present in FIG. 1 of the standard shifter translator, and having the same structure and the same operation, are marked with the same identifiers previously used.

The shifter translator 2 comprises two circuit branches, a first circuit branch 4 comprising a first transistor M1 and a second circuit branch 5 comprising a second transistor M2.

In the example shown in FIG. 2 the two transistors M1 and M2 are of the NMOS type. Naturally, this is not binding and all the transistors which will be described could be substituted in a dual way.

The first transistor M1 and the second transistor M2 are connected to respective first common conduction terminals and they are connected to a first potential reference which, in the specific case, is the ground potential GND.

Moreover, the first M1 and the second transistor M2 receive, on the respective control terminals, G1 and G2, input differential voltages respectively $\overline{Vin}$ and Vin.

Advantageously, the first M1 and the second transistor M2, belonging to the first 4 and to the second circuit branch 5, refer to a biasing circuit 3 with a current mirror.

In particular, the second transistor M2 is coupled to the biasing circuit 3 through a third transistor M3 of the MOS and, in the specific case, NMOS type.

A second conduction terminal, of the second transistor M2, is directly connected to a first conduction terminal of the third transistor M3 in correspondence with a circuit node C.

Advantageously, according to an embodiment of the invention, the biasing circuit 3 with current mirror is connected to the circuit node A and the second circuit node B. In particular, the biasing circuit 3 has a fourth transistor M4 and a fifth transistor M5 which, in the specific case, are of the PMOS type, and are connected to common control terminals G4 and G5 and connected to a circuit node E, which is in turn directly connected to the second circuit branch 5 in correspondence with the circuit node A.

The fifth transistor M5 has a first conduction terminal connected to the circuit node A, while the fourth transistor M4 has a first conduction terminal connected to the circuit node B.

The first conduction terminals of the fourth M4 and of the fifth transistor M5 define also the outputs of the biasing circuit 3. The fourth transistor M4 and the fifth transistor M5 also have second conduction terminals connected to each other and connected towards a second potential reference which, in the specific case, is the supply VDD voltage HV.

The biasing circuit 3 with current mirror suitably has a ratio 1:N between the currents circulating in the fifth transistor M5 and in the fourth transistor M4.

Advantageously, an inverter 6, which is supplied through the second potential reference or supply VDD voltage HV, is connected to the circuit node B of the first circuit branch 4.

Suitably, according to an embodiment of the invention, the inverter 6 drives, through the output terminal Vout, the third transistor M3. In particular, the output terminal Vout of the inverter 6 corresponds to a circuit node D and also to an output terminal of the shifter translator 2. Advantageously the inverter 6 controls the third transistor M3 with an operation as controlled switch.

The operation of the shifter translator 2 according to an embodiment of the present invention is now described.

In the transition of the output terminal Vout of the shifter translator 2 from a high logic value to a low logic value, VDD=>GND, the signal Vin is brought to a low logic value (LV) and $\overline{Vin}$ to a high logic value (LV), the second transistor M2 is active and the biasing circuit 3 with current mirror, by means of the current which circulates in the conductive path M5-M3-M2, enhances the voltage value of the circuit node B.

When the voltage on the circuit node B reaches a value equal to VDD/2, the inverter 6 changes state and the voltage in the output terminal Vout passes from a high state to a low state (VDD=>GND) and blocks the conductive path M5-M3-M2, thus bringing the voltage on the control terminal G3 of the third transistor M3 to zero.

As it can be observed, the transition described occurs in the shifter translator 2 thanks to a current conductive path without the need to start, in the shifter translator 2, a positive feedback. This often speeds up the transition, thus improving the operating efficiency.

In the opposite transition, i.e., in the passage of the output voltage Vout of the shifter translator 2 from a low logic value to a high one, GND=>VDD, the first transistor M1 is turned on, i.e., Vin is brought to a high logic state (dynamic LV) while the second transistor M2 is turned off bringing $\overline{Vin}$ to a low logic state (dynamic LV). The first transistor M1, which is on, lowers the voltage on the circuit node B until it reaches the first voltage reference or ground voltage GND.

The circuit node B is also connected to the input terminal Vinv of the inverter 6, and when its voltage reaches a value equal to VDD/2, the inverter 6 switches, bringing the output Vout to a high logic value and prepares the translator 2 for the successive transition VDD=>GND. In fact, with the output voltage Vout at high logic value, the third transistor M3 is on. However, no current circulates in the conductive path M5-M3-M2 of the biasing circuit 3 with current mirror since the second transistor M2 is off until the voltage $\overline{Vin}$ is switched.

Therefore, the shifter translator 2, realized according to an embodiment of the present invention, in the absence of positive feedback, may speed up the transition times from the low logic value to the high one and vice versa. In fact, thanks to the presence of the biasing circuit 3 with current mirror connected to the inverter 6, the voltage value of the circuit node B switches to VDD/2. Moreover, as it is well known, current-mirror circuits, thanks to their specific topology, often stabilize generated currents relative to temperature variations to which the circuit may be subjected.

Next, are described additional embodiments. In the description these embodiments, for the components and the signals already discussed in the shifter translator 2, and having the same structure and the same operation, will be given the same identifiers already used in the previous figures.

Figure 3:
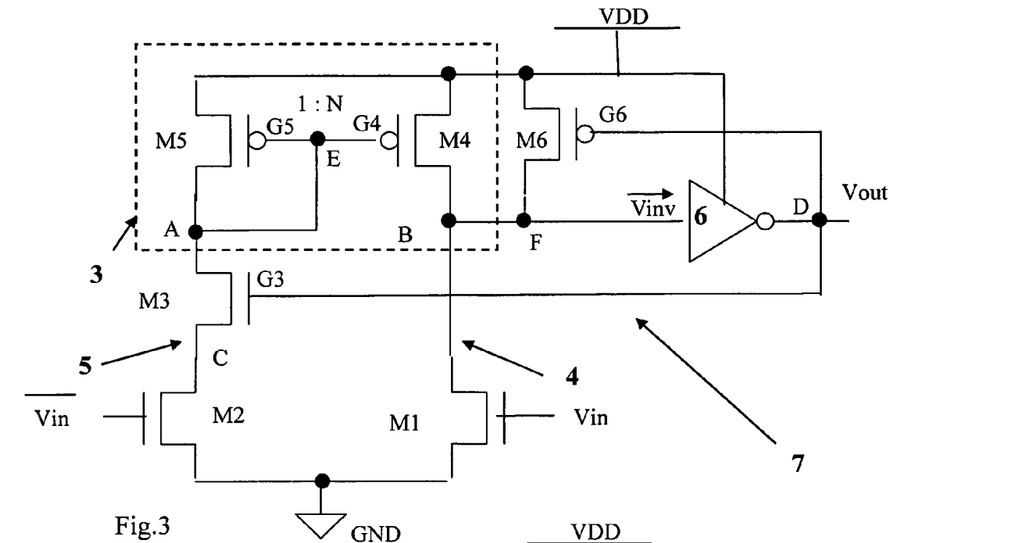
FIGS. 3 to 7 show five different embodiments of a shifter translator.

For example a first embodiment of a voltage-shifter translator is shown in FIG. 3, where the shifter translator is globally indicated with number 7.

The shifter translator 7 comprises two circuit branches, a first circuit branch 4 and a second circuit branch 5, which have a configuration identical to the one described above and which comprise a first transistor M1 and a second transistor M2.

Advantageously, the first M1 and the second M2 transistor refer to a biasing circuit 3 with a current mirror.

In particular, the second transistor M2 is coupled to the biasing circuit 3 through a third transistor M3.

The first 4 and the second circuit branch 5 have a circuit node A and a circuit node B in correspondence with the connection of the biasing circuit 3 and thus in correspondence with a conduction terminal of the third transistor M3 and of the first transistor M1.

The biasing circuit 3 with a current mirror has a configuration identical to the configuration previously described in conjunction with FIG. 2, and in particular it comprises a fourth M4 and a fifth transistor M5 with common conduction terminals G4 and G5 and connected to a circuit node E, which is directly connected to the circuit node A. The fifth M5 and the fourth M4 transistor are also connected with respective first conduction terminals to the circuit node A and to the circuit node B while second conduction terminals are connected to each other and to a second potential reference or supply voltage VDD. The biasing circuit 3 suitably has a ratio 1:N between the currents circulating in the fifth transistor M5 and in the fourth transistor M4.

Advantageously, the circuit node B, of the first circuit branch 4, is connected to an inverter 6 supplied through the supply reference voltage VDD. Suitably, the inverter 6 drives, through the output terminal Vout, the third transistor M3 and it allows its operation as a controlled switch. The output terminal Vout of the inverter 6 also corresponds to an output terminal of the shifter translator 7.

Advantageously, according to the present embodiment, a sixth MOS transistor M6, which, in this specific case, is of the PMOS type, is connected in parallel to the fourth transistor M4 with a first conduction terminal connected to a circuit node F, which coincides with the circuit node B, and with a second conduction terminal connected to the supply VDD voltage HV.

Suitably, the sixth transistor M6 is driven by the output voltage Vout of the inverter 6.

Advantageously in fact, during the operation of the shifter translator 7, when the first transistor M1 and the biasing circuit 3 are off, i.e., the voltage Vin is at a low voltage value (LV), $\overline{\text{Vin}}$ is at a high logic value (LV), and Vout is at a low logic value (HV), the sixth transistor M6 is active and operates as a resistive element. In particular the sixth transistor M6 maintains the voltage on the circuit node B at value VDD with a low impedance, avoiding possible fluctuations in Vout.

This may improve the performances of the shifter translator 7 when the output voltage Vout is at a low logic value.

Figure 4:
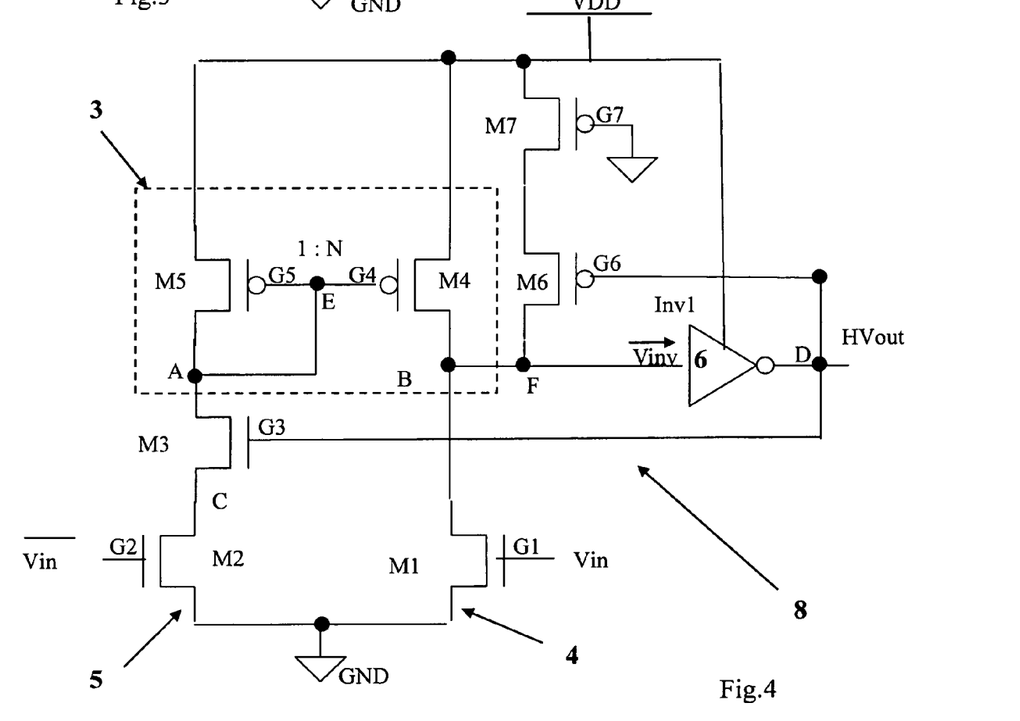

A second embodiment is shown in FIG. 4 where a shifter translator 8 varies with respect to the above-described shifter translator 7 by the addition of a seventh MOS transistor M7, which, in the specific case, is of the PMOS type, connected in series to the sixth transistor M6.

Advantageously, according to the present embodiment, the seventh transistor M7 is connected with a first conduction terminal to the second conduction terminal of the sixth transistor M6 and with the second conduction terminal to the supply voltage VDD. The seventh transistor M7 receives, on the control terminal G7, the ground reference voltage GND.

Advantageously during the operation of the shifter translator 8, when the first transistor M1 and the circuit 3 are off, i.e., the voltage Vin and Vout at low logic value, and $\overline{\text{Vin}}$ at high logic value, the sixth active transistor M6 acts as a resistance maintaining the voltage of the circuit node B at value VDD with a low impedance. Moreover, however, the presence of the seventh active transistor M7 maintains the effective capacitance present at the input of the inverting circuit 6 minimal, and thus approximately equal to Cgs of the transistor M6. Moreover, the transistor M7 reduces the charge injection of the node VDD generated, in the previous case, by the switching transistor M6. A further advantage is that when Vin is at a high logic value and the node B decreases to GND, M1 must "battle" a lower conductance, given by the series combination of M6 and M7.

Figure 5:
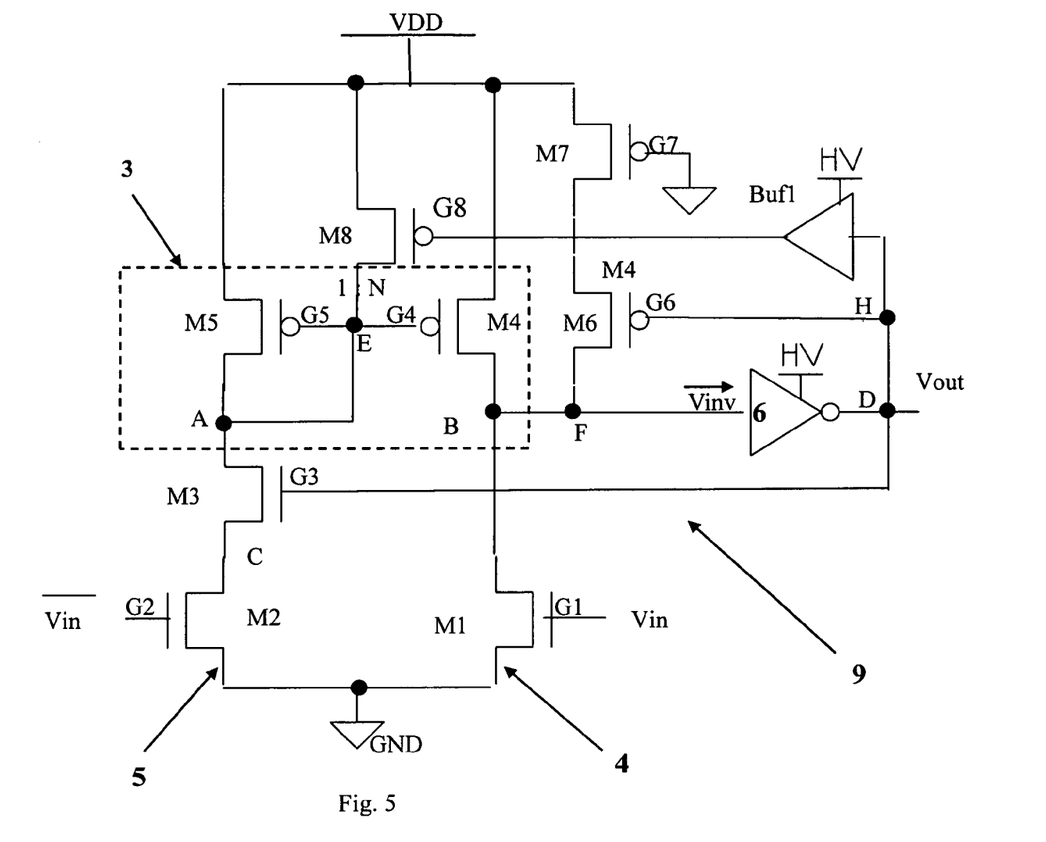

A further embodiment of a level translator is shown in FIG. 5 and globally indicated with number 9. This embodiment differs from the one of FIG. 4 by the addition of an eighth MOS transistor M8, which, in the specific case, is of the PMOS type, connected to a buffer Buf1.

Advantageously, the eighth transistor M8 has a first conduction terminal connected to the circuit node E of the biasing circuit 3 and a second conduction terminal connected to the second reference voltage or supply voltage VDD.

The buffer Buf1, driven by the supply voltage VDD, has an input terminal connected to the output Vout of the inverter 6 while the output terminal, connected to the control terminal G8, drives the eighth transistor M8.

Advantageously according to this embodiment, the eighth transistor M8, being on during the transition of the output voltage Vout of the shifter translator 9 from the low logic state to the high logic state L=>H, maintains the biasing circuit 3 off for the whole duration of the transition. Suitably the buffer Buf1 inserts a certain delay in the turn off of the eighth transistor M8.

During the operation in this transition, L->H, the voltage Vin passes from a low logic value to a high one, thus turning on the first transistor M1, which makes the voltage on the circuit node B decrease, bringing it towards the ground voltage GND. Capacitively, however, the circuit node B might also lead the control terminal G4 of the fourth transistor M4 towards a low logic value. This could involve both the turn on of the biasing circuit 3, with a useless power waste, and voltage bounces on the circuit node B towards a high logic value with possible re-turn on of the inverter 6 and oscillations on the value of the output voltage Vout.

It is good to observe, however, that a direct connection between the eighth transistor M8 and the output terminal Vout of the inverter 6 might allow for a period of time, although short, such a voltage at the circuit node E as to activate the biasing circuit 3. Thus the buffer Buf1 provides a certain delay that maintains the biasing circuit 3 off for the transition time.

Other possible embodiments of the shifter translator 9 can regard all the possible realizations of the buffer Buf1, naturally all within the reach of the person skilled in the art. In fact, for example if the capacitive load that the shifter translator must drive is very high, the buffer Buf1 can be sized as a pair of inverters of increasing sizes which control the eighth transistor M8 in cascade.

Figure 6:
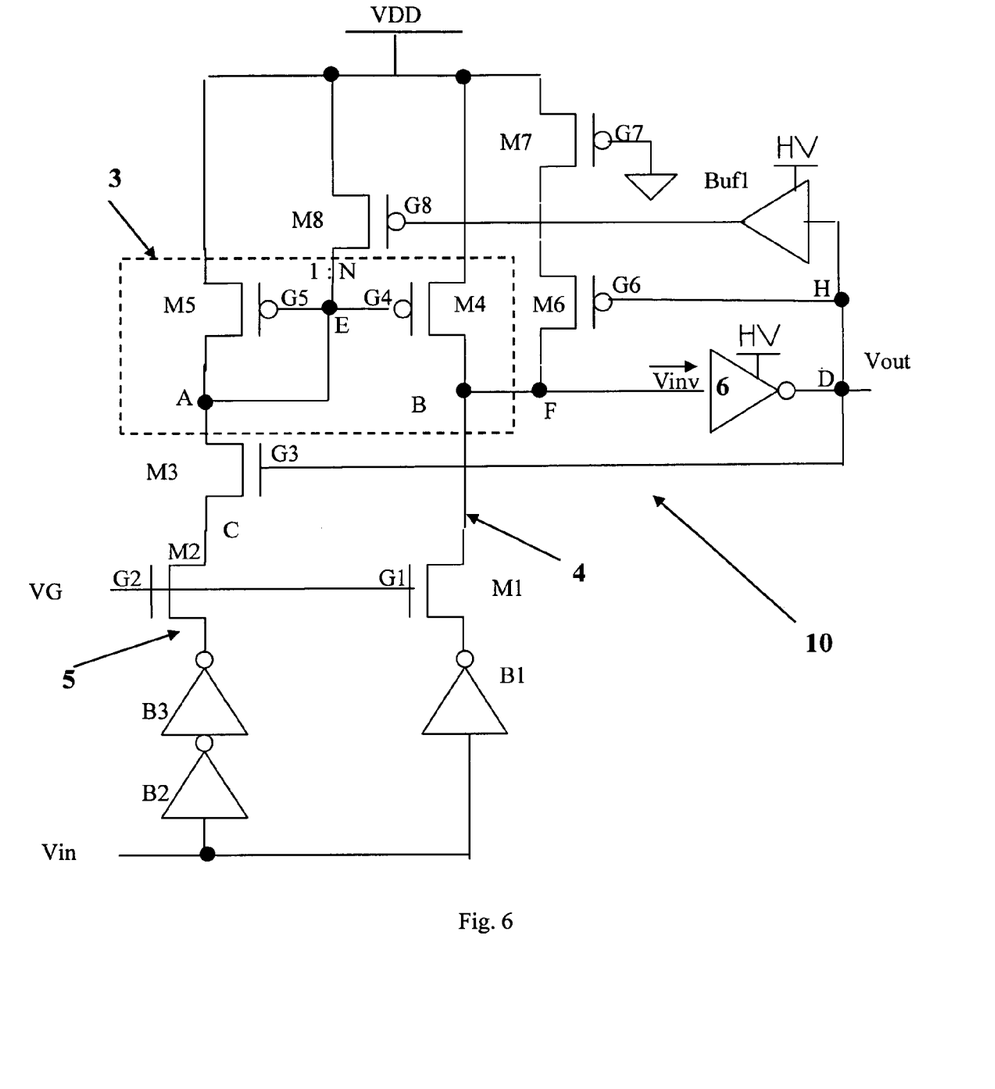

A further embodiment of the level shifter translator is shown in FIG. 6. In this embodiment, with respect to the solution previously shown in FIG. 5, a level shifter translator 10 has a variation in the connection between the first M1 and the second transistor M2.

The first 4 and the second circuit branch 5 of the shifter translator 10, comprise, according to an arrangement similar to the one previously described, the first M1 and the second transistor M2.

Advantageously the first M1 and the second transistor M2 are driven by a same voltage value equal to VG and in particular they have first conduction terminals connected to the voltage value Vin respectively by means of an inverting buffer B1 and by means of a pair of inverting buffers, B2 and B3, placed in series.

Advantageously this embodiment avoids a possible capacitive coupling between the second conduction terminal of each transistor M1 or M2, respectively circuit node B and C, and the control terminal, G1 or G2, of the same transistor in case the input voltage, $\overline{\text{Vin}}$ or Vin, is placed at a low logic value.

In particular, a variation of the voltage on the circuit node B does not influence the state of the first M1 and of the second transistor M2. Moreover, advantageously, the movement of the driving signals, which, in this case, are connected to the conduction terminal (source) of the first M1 and of the second transistor M2, are in phase with the movement of the driven nodes B and C of the shifter translator 10. The charge injection, in the shifter translator 10, is thus favorable to the switch. Moreover, advantageously, if the voltage VG is a value between the second voltage value or low voltage supply VDD (LV) and the value VDD(LV) summed to Vth(HV), (where Vth(HV) is the threshold voltage high logic value of the first M1 and of the second transistor M2, which are HV—high voltage transistors having to sustain voltage excursions in the range 0-VDD, where VDD is a high voltage, e.g., 10V), the shifter translator 10 responds more quickly for a higher overdrive on the transistors M1-M2. Naturally, an excessive voltage value of VG might create a current leakage and thus an increase of the absorbed power, thereby possibly limiting the field of application of the shifter translator 10.

Moreover, with this embodiment, if the voltage VG is equal to the supply voltage VDD(LV) value, the obtainable time gain of the shifter translator 10 is almost negligible, also because propagation delays due to the presence of the inverting buffers B1, B2 and B3 are to be taken into account.

Naturally, all the previously described embodiments of the level-shifter translator can alternatively have the first M1 and the second transistor M2 connected to each other according to this latter description (e.g., with buffers B1, B2, B3).

Figure 7:
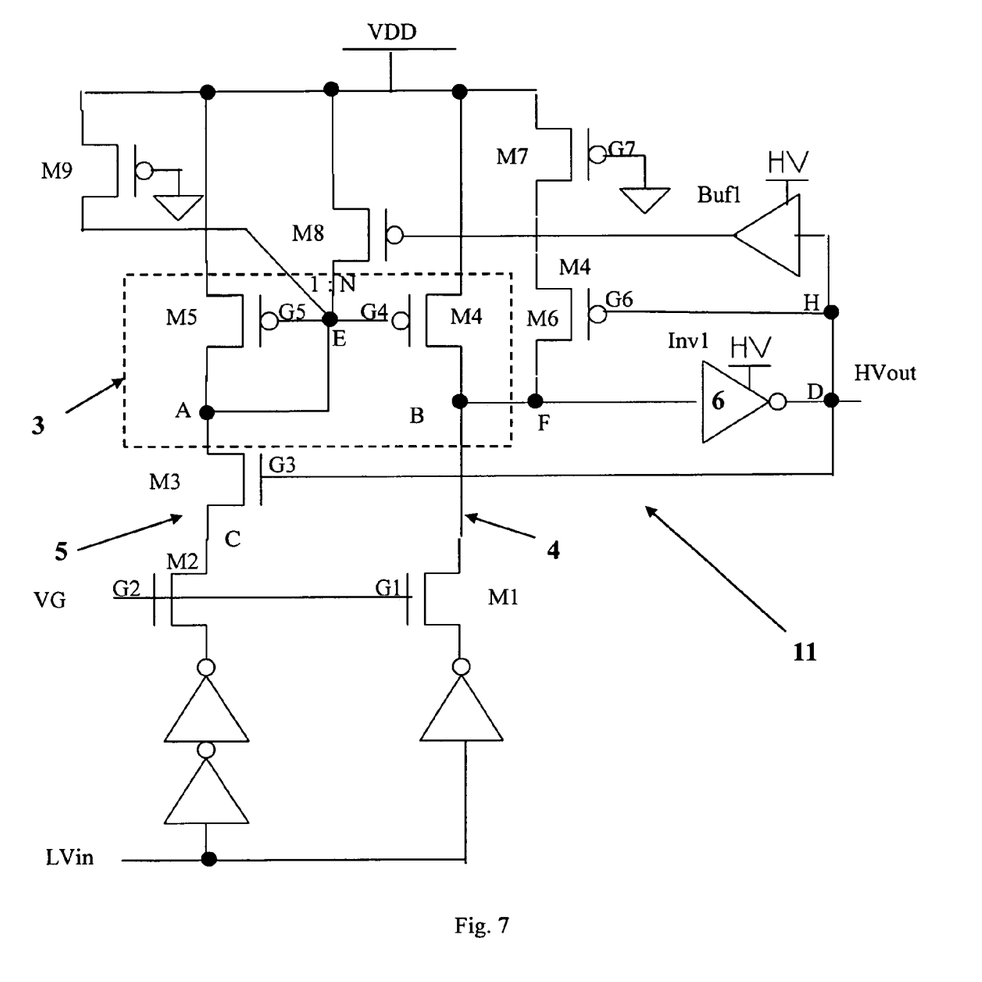

A further embodiment is shown in FIG. 7 where a level shifter translator is globally indicated with number 11.

This embodiment is substantially similar to the solution shown in FIG. 6 wherein a ninth MOS transistor M9, which, in the specific case, is of the PMOS type, is placed in parallel to the eighth transistor M8.

The ninth transistor M9 has a control terminal placed at the ground voltage GND, a first conduction terminal placed at the supply voltage VDD and a second conduction terminal connected to the circuit node E of the biasing circuit 3.

Advantageously, the ninth transistor M9 acts as resistance interposed between the circuit node E and the supply voltage VDD and it turns off completely the biasing circuit 3 when the circuit node B is at the ground voltage GND.

All the various embodiments proposed include a shifter translator which may allow a translation with a current conductive path without the need to start, in the shifter translator itself, a positive feedback as described above in conjunction with FIG. 1. Moreover, all the embodiments proposed may speed up the transition times, thus improving the operating efficiency.

One or more of the translators of FIGS. 2-7 may be incorporated into an integrated circuit (IC) such as a non-volatile memory, which may be incorporated in an electronic systems such as a computer system.

From the foregoing it will be appreciated that, although specific embodiments of the invention have been described herein for purposes of illustration, various modifications may be made without deviating from the spirit and scope of the invention.

What is claimed is:

1. A level shifter translator, comprising:
    at least one first transistor and one second MOS transistor belonging to respective circuit branches connected with a first common conduction terminal and connected towards a first potential reference and receiving, on the respective conduction terminals, input differential voltages, wherein
    said first and second transistor have said respective circuit branches referring to a biasing circuit with current mirror;
    said second transistor is coupled to said biasing circuit through a third MOS transistor;
    an inverter is connected to an output of said biasing circuit; and
    the output of said inverter drives said third transistor; and
    wherein said biasing circuit with current mirror comprises a fourth and a fifth MOS transistor connected to common control terminals and connected towards a circuit node which is directly connected to said second circuit branch and with a first conduction terminal connected respectively to said first and second circuit branch and to a second common conduction terminal connected towards a second potential reference;
    wherein said second transistor is connected with a second conduction terminal to a first conduction terminal of said third transistor in correspondence with a circuit node in said circuit branch;
    wherein said first and second circuit branch have a first circuit node and a second circuit node in correspondence with a second conduction terminal of said third transistor and a second conduction terminal of said first transistor and in that said circuit node of said biasing circuit is directly connected to said first circuit node;
    wherein said first conduction terminal of said fourth transistor is connected to said second circuit node and in that said first conduction terminal of said fifth transistor is connected to said first circuit node;
    wherein said second circuit node is connected to said inverter supplied through said second potential reference;
    a sixth MOS transistor is placed in parallel to said fourth transistor driven by said output of said inverter with a first conduction terminal connected to said second circuit node and to a second conduction terminal connected towards said second potential reference; and
    a seventh MOS transistor is connected in series to said sixth transistor driven by said first reference potential and to a first conduction terminal connected to said second conduction terminal of said sixth transistor and with a second conduction terminal connected to said second potential reference.

2. The level shifter translator according to claim 1 wherein said biasing circuit with current mirror has a ratio 1:N between the currents circulating in said fourth transistor and in said fifth transistor.

3. A level shifter translator, comprising:
    at least one first transistor and one second MOS transistor belonging to respective circuit branches connected with a first common conduction terminal and connected towards a first potential reference and receiving, on the respective conduction terminals, input differential voltages, wherein
    said first and second transistor have said respective circuit branches referring to a biasing circuit with current mirror;
    said second transistor is coupled to said biasing circuit through a third MOS transistor;
    an inverter is connected to an output of said biasing circuit;
    the output of said inverter drives said third transistor;
    wherein said biasing circuit with current mirror comprises a fourth and a fifth MOS transistor connected to common control terminals and connected towards a circuit node which is directly connected to said second circuit branch and with a first conduction terminal connected respectively to said first and second circuit branch and to a second common conduction terminal connected towards a second potential reference;
    wherein said second transistor is connected with a second conduction terminal to a first conduction terminal of said third transistor in correspondence with a circuit node in said circuit branch;

wherein said first and second circuit branch have a first circuit node and a second circuit node in correspondence with a second conduction terminal of said third transistor and a second conduction terminal of said first transistor and in that said circuit node of said biasing circuit is directly connected to said first circuit node;

a sixth MOS transistor placed in parallel to said fourth transistor driven by said output of said inverter with a first conduction terminal connected to said second circuit node and to a second conduction terminal connected towards said second potential reference;

a seventh MOS transistor connected in series to said sixth transistor driven by said first reference potential and to a first conduction terminal connected to said second conduction terminal of said sixth transistor and with a second conduction terminal connected to said second potential reference; and an eighth MOS transistor having a first conduction terminal connected to said circuit node of said biasing circuit and a second conduction terminal connected to said second potential reference, said eighth transistor driven by the output signal of a buffer driven by said second voltage reference with an input terminal connected to said output of said inverter.

4. A level translator, comprising:
a differential input stage having first and second input nodes operable to receive a differential input logic signal having a first amplitude, and having first and second output nodes; and
a current mirror having an input node and an output node respectively coupled to the first and second output nodes of the input stage, the current mirror operable to generate on one of the first and second output nodes an output logic signal having a second amplitude;
a supply node;
an inverter having an input node coupled to the output node of the current mirror and having an output node;
a first switch having a switch path coupled between the input node of the current mirror and the first output node of the differential input stage and having a control node coupled to the output node of the inverter; and
a second switch having a switch path coupled between the supply node and the input node of the inverter and having a control node coupled to the output node of the inverter;
a second supply node;
wherein the current mirror comprises a reference node coupled to the first supply node and is operable to generate the output logic signal on the output node of the current mirror;
wherein the input stage comprises a reference node coupled to the second supply node;
a first transistor having a first conduction node coupled to the input node of the inverter, a second conduction node, and a control node coupled to the output node of the inverter; and
a second transistor having a first conduction node coupled to the second conduction node of the first transistor, a second conduction node coupled to the first supply node, and a control node coupled to the second supply node.

5. The level translator of claim 4 wherein the output logic signal comprises a single ended output logic signal.

6. A level translator, comprising:
a differential input stage having first and second input nodes operable to receive a differential input logic signal having a first amplitude, and having first and second output nodes;
a current mirror having an input node and an output node respectively coupled to the first and second output nodes of the input stage, the current mirror operable to generate on one of the first and second output nodes an output logic signal having a second amplitude;
first and second supply nodes;
wherein the current mirror comprises a reference node coupled to the first supply node and is operable to generate the output logic signal on the output node of the current mirror;
wherein the input stage comprises a reference node coupled to the second supply node;
an inverter having an input node coupled to the output node of the current mirror and having an output node;
a first switch having a switch path coupled between the input node of the current mirror and the first output node of the differential input stage and having a control node coupled to the output node of the inverter;
a first transistor having a first conduction node coupled to the input node of the inverter, a second conduction node, and a control node coupled to the output node of the inverter;
a second transistor having a first conduction node coupled to the second conduction node of the first transistor, a second conduction node coupled to the first supply node, and a control node coupled to the second supply node;
a delay circuit having an input node coupled to the output node of the inverter and having an output node; and
a second switch having a first conduction node coupled to the input node of the current mirror, a second conduction node coupled to the first supply node, and a control node coupled to the output node of the delay circuit.

7. The level translator of claim 6 wherein the differential input stage comprises:
a first transistor having a first conduction node and a control node respectively coupled to the first output node and to the first input node of the input stage; and
a second transistor having a first conduction node and a control node respectively coupled to the second output node and to the second input node of the input stage.

8. A level translator, comprising:
a differential input stage having first and second input nodes operable to receive a differential input logic signal having a first amplitude, and having first and second output nodes; and
a current mirror having an input node and an output node respectively coupled to the first and second output nodes of the input stage, the current mirror operable to generate on one of the first and second output nodes an output logic signal having a second amplitude;
the level shifter further comprising:
a supply node;
wherein the current mirror comprises a reference node coupled to the supply node; and
an impedance element coupled between the supply node and the input node of the current mirror.

9. An integrated circuit, comprising:
a level translator, including,
a differential input stage having first and second input nodes operable to receive a differential input logic signal having a first amplitude, and having first and second output nodes, and
a current mirror having an input node and an output node respectively coupled to the first and second output nodes of the input stage, the current mirror operable to generate on one of the first and second output nodes an output logic signal having a second amplitude; and wherein the level translator further comprises,
  a supply node;
  wherein the current mirror comprises a reference node coupled to the supply node; and
  an impedance element coupled between the supply node and the input node of the current mirror.

10. An electronic system, comprising:
  an integrated circuit, including,
    a level translator, including,
      a differential input stage having first and second input nodes operable to receive a differential input logic signal having a first amplitude, and having first and second output nodes, and
      a current mirror having an input node and an output node respectively coupled to the first and second output nodes of the input stage, the current mirror operable to generate on one of the first and second output nodes an output logic signal having a second amplitude; and
    wherein the level translator further comprises,
      a supply node;
      wherein the current mirror comprises a reference node coupled to the supply node; and
      an impedance element coupled between the supply node and the input node of the current mirror.

* * * * *

UNITED STATES PATENT AND TRADEMARK OFFICE
CERTIFICATE OF CORRECTION

PATENT NO.        : 7,504,862 B2
APPLICATION NO.   : 11/321732
DATED             : March 17, 2009
INVENTOR(S)       : Guido De Sandre, Marco Poles and Marco Pasotti It is certified that error appears in the above-identified patent and that said Letters Patent is hereby corrected as shown below:

- In Claim 8, Column 10, Line 51 change the text "level shifter further comprising" to -- the level translator further comprising --.

Signed and Sealed this

Twelfth Day of October, 2010

David J. Kappos
*Director of the United States Patent and Trademark Office*